United States Patent
Terasaki et al.

(10) Patent No.: US 12,550,731 B2
(45) Date of Patent: Feb. 10, 2026

(54) COPPER/CERAMIC ASSEMBLY, INSULATING CIRCUIT SUBSTRATE, PRODUCTION METHOD FOR COPPER/CERAMIC ASSEMBLY, AND PRODUCTION METHOD FOR INSULATING CIRCUIT SUBSTRATE

(71) Applicant: MITSUBISHI MATERIALS CORPORATION, Tokyo (JP)

(72) Inventors: Nobuyuki Terasaki, Saitama (JP); Akira Sakurai, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 63 days.

(21) Appl. No.: 18/560,166

(22) PCT Filed: Jul. 15, 2022

(86) PCT No.: PCT/JP2022/027861
§ 371 (c)(1),
(2) Date: Nov. 10, 2023

(87) PCT Pub. No.: WO2023/286858
PCT Pub. Date: Jan. 19, 2023

(65) Prior Publication Data
US 2024/0274497 A1 Aug. 15, 2024

(30) Foreign Application Priority Data
Jul. 16, 2021 (JP) .................. 2021-117953

(51) Int. Cl.
*H01L 23/373* (2006.01)
*H01L 21/48* (2006.01)

(52) U.S. Cl.
CPC ...... *H01L 23/3735* (2013.01); *H01L 21/4857* (2013.01)

(58) Field of Classification Search
CPC .................................................. H01L 23/3735
(Continued)

(56) References Cited

U.S. PATENT DOCUMENTS

| 2014/0126155 A1 | 5/2014 | Imamura et al. |
| 2019/0150298 A1* | 5/2019 | Kishimoto ............... C22C 5/06 174/252 |

(Continued)

FOREIGN PATENT DOCUMENTS

| JP | H05-170563 A | 7/1993 |
| JP | 3211856 B2 | 9/2001 |

(Continued)

OTHER PUBLICATIONS

International Search Report mailed Oct. 4, 2022, issued for PCT/JP2022/027861 and English translation thereof.

(Continued)

*Primary Examiner* — Katherine A Christy
(74) *Attorney, Agent, or Firm* — Troutman Pepper Locke LLP (57) ABSTRACT

This copper/ceramic assembly includes: a copper member consisting of copper or a copper alloy; and a ceramic member, wherein the copper member and the ceramic member are bonded to each other. At a bonded interface between the ceramic member and the copper member, an active metal compound layer is formed on a side of the ceramic member. In a region extending by 10 μm from the active metal compound layer toward a side of the copper member, an area rate of an active metal carbide is 8% or less.

16 Claims, 4 Drawing Sheets

(58) Field of Classification Search
USPC .......................................................... 428/469
See application file for complete search history.

(56) References Cited

U.S. PATENT DOCUMENTS

2019/0327831 A1   10/2019   Kato et al.
2021/0398928 A1   12/2021   Yonetsu et al.

FOREIGN PATENT DOCUMENTS

| | | |
|---|---|---|
| JP | 5757359 B2 | 7/2015 |
| JP | 2018-008869 A | 1/2018 |
| WO | 2013/002407 A1 | 1/2013 |
| WO | 2017/213207 A1 | 12/2017 |
| WO | 2018/003845 A1 | 1/2018 |
| WO | 2018/180965 A1 | 10/2018 |
| WO | 2019/088222 A1 | 5/2019 |
| WO | 2021/044854 A1 | 3/2021 |
| WO | 2021/124923 A1 | 6/2021 |

OTHER PUBLICATIONS

Office Action mailed Sep. 3, 2024, issued for JP2021-117953 and English translation thereof.

\* cited by examiner

COPPER/CERAMIC ASSEMBLY, INSULATING CIRCUIT SUBSTRATE, PRODUCTION METHOD FOR COPPER/CERAMIC ASSEMBLY, AND PRODUCTION METHOD FOR INSULATING CIRCUIT SUBSTRATE

TECHNICAL FIELD

The present invention relates to: a copper/ceramic assembly obtained by bonding a copper member consisting of copper or a copper alloy to a ceramic member; an insulating circuit substrate obtained by bonding a copper sheet consisting of copper or a copper alloy to a surface of a ceramic substrate; a method for producing a copper/ceramic assembly; and a method for producing an insulating circuit substrate.

The present application claims priority on Japanese Patent Application No. 2021-117953 filed on Jul. 16, 2021, the content of which is incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer consisting of a conductive material is formed on one surface of an insulating layer.

For example, a power semiconductor element for high power control, which is used for controlling a wind power generation, an electric vehicle, a hybrid vehicle, or the like, generates a large amount of heat during operation, and thus, an insulating circuit substrate has been widely used in the related art as a substrate on which the power semiconductor element is mounted, and the insulating circuit substrate includes: a ceramic substrate; a circuit layer formed by bonding a metal sheet having excellent electrical conductivity to one surface of the ceramic substrate; and a metal layer for heat radiation, which is formed by bonding a metal sheet to the other surface of the ceramic substrate.

For example, Patent Document 1 proposes an insulating circuit substrate in which a circuit layer and a metal layer are formed by bonding a copper sheet to each of one surface and the other surface of a ceramic substrate. In Patent Document 1, the copper sheet is disposed on each of the one surface and the other surface of the ceramic substrate with an Ag—Cu—Ti-based brazing material being interposed, and then a heating treatment is carried out to bond the copper sheet (so-called active metal brazing method).

In addition, Patent Document 2 proposes a power module substrate in which a copper sheet consisting of copper or a copper alloy is bonded to a ceramic substrate consisting of AlN or $Al_2O_3$ by using a bonding material containing Ag and Ti.

Further, Patent Document 3 proposes a power module substrate in which a copper sheet consisting of copper or a copper alloy is bonded to a ceramic substrate consisting of silicon nitride by using a bonding material containing Ag and Ti.

As described above, in a case of bonding a copper sheet to a ceramic substrate using a bonding material containing Ti, Ti which is an active metal reacts with the ceramic substrate; and thereby, the wettability of the bonding material is improved, and the brazing bonding strength between the copper sheet and the ceramic substrate is improved.

By the way, in recent years, there is a tendency that a heat generation temperature of a semiconductor element mounted on an insulating circuit substrate increases, and an insulating circuit substrate is required to have a thermal cycle reliability that can withstand a thermal cycle more severe than a thermal cycle in the related art.

In a case of bonding a copper sheet to a ceramic substrate using a bonding material containing Ti, as described above, there is a risk that a portion in a vicinity of the bonded interface becomes hard, breaking occurs in the ceramic member during loading of a thermal cycle, and the thermal cycle reliability deteriorates.

CITATION LIST

Patent Documents

[Patent Document 1]
  Japanese Patent No. 3211856
[Patent Document 2]
  Japanese Patent No. 5757359
[Patent Document 3]
  Japanese Unexamined Patent Application, First Publication No. 2018-008869

SUMMARY OF INVENTION

Technical Problem

The present invention has been made in consideration of the above-described circumstances, and an objective of the present invention is to provide: a copper/ceramic assembly having an excellent thermal cycle reliability, which can suppress the occurrence of breaking in a ceramic member even in a case where a severe thermal cycle is loaded; an insulating circuit substrate consisting of the copper/ceramic assembly; a method for producing a copper/ceramic assembly; and a method for producing an insulating circuit substrate.

Solution to Problem

As a result of diligent studies by the inventors of the present invention in order to solve the above-described problems, it was found that in a case where carbon is present at the bonded interface when a ceramic member and a copper member have been bonded using a bonding material containing an active metal, the active metal reacts with the carbon to form an active metal carbide, and the bonded interface is hardened due to curing by the active metal carbide. The inventors of the present invention obtained a knowledge that for this reason, by optimizing the abundance of the active metal carbide, it is possible to suppress the occurrence of breaking in the ceramic member during loading of a thermal cycle.

The present invention has been made based on the above-described findings, and the copper/ceramic assembly according to one aspect of the present invention is a copper/ceramic assembly obtained by bonding a copper member consisting of copper or a copper alloy to a ceramic member, in which at a bonded interface between the ceramic member and the copper member, an active metal compound layer is formed on a side of the ceramic member, and in a region extending by 10 μm from the active metal compound layer toward a side of the copper member, an area rate of an active metal carbide is 8% or less.

It can also be said that the copper/ceramic assembly includes the copper member and the ceramic member, and the copper member and the ceramic member are bonded to each other.

According to the copper/ceramic assembly of one aspect of the present invention, an active metal compound layer is formed on a side of the ceramic member at a bonded interface between the ceramic member and the copper member, and in a region extending by 10 μm from the active metal compound layer toward a side of the copper member, an area rate of an active metal carbide is 8% or less. Thereby, it is possible to suppress the hardening of the bonded interface, and it is possible to suppress the occurrence of breaking of the ceramic member during loading of a thermal cycle.

In the copper/ceramic assembly according to one aspect of the present invention, it is preferable that a thickness $t1$ of the active metal compound layer is in a range of 0.05 μm or more and 1.2 μm or less.

In this case, since the thickness $t1$ of the active metal compound layer is in a range of 0.05 μm or more and 1.2 μm or less, the active metal reliably and firmly bonds the ceramic member and the copper member, and concurrently, the hardening of the bonded interface is suppressed.

In addition, in the copper/ceramic assembly according to one aspect of the present invention, it is preferable that at the bonded interface between the ceramic member and the copper member, an Ag—Cu alloy layer is formed on the side of the copper member, and a thickness $t2$ of the Ag—Cu alloy layer is in a range of 1 μm or more and 30 μm or less.

In this case, Ag of the bonding material is sufficiently reacted with the copper member to bond the ceramic member and the copper member reliably and firmly, and concurrently, the hardening of the bonded interface is suppressed.

The insulating circuit board according to one aspect of the present invention is an insulating circuit substrate obtained by bonding a copper sheet consisting of copper or a copper alloy to a surface of a ceramic substrate, in which a bonded interface between the ceramic substrate and the copper sheet, an active metal compound layer is formed on a side of the ceramic substrate, and in a region extending by 10 μm from the active metal compound layer toward a side of the copper sheet, an area rate of an active metal carbide is 8% or less.

It can also be said that the insulating circuit substrate includes the ceramic substrate and the copper sheet, and the copper sheet is bonded to the surface of the ceramic substrate.

According to the insulating circuit substrate of one aspect of the present invention, an active metal compound layer is formed on a side of the ceramic substrate at a bonded interface between the ceramic substrate and the copper sheet, and in a region extending by 10 μm from the active metal compound layer toward a side of the copper sheet, an area rate of an active metal carbide is 8% or less. Thereby, it is possible to suppress the hardening of the bonded interface, and it is possible to suppress the occurrence of breaking of the ceramic substrate during loading of a thermal cycle.

In the insulating circuit substrate according to one aspect of the present invention, it is preferable that a thickness $t1$ of the active metal compound layer is in a range of 0.05 μm or more and 1.2 μm or less.

In this case, since the thickness $t1$ of the active metal compound layer is in a range of 0.05 μm or more and 1.2 μm or less, the active metal reliably and firmly bonds the ceramic substrate and the copper sheet, and concurrently, the hardening of the bonded interface is suppressed.

In addition, in the insulating circuit substrate according to one aspect of the present invention, it is preferable that at the bonded interface between the ceramic substrate and the copper sheet, an Ag—Cu alloy layer is formed on the side of the copper sheet, and a thickness $t2$ of the Ag—Cu alloy layer is in a range of 1 μm or more and 30 μm or less.

In this case, Ag of the bonding material is sufficiently reacted with the copper sheet to bond the ceramic substrate and the copper sheet reliably and firmly, and concurrently, the hardening of the bonded interface is suppressed.

The method for producing a copper/ceramic assembly according to one aspect of the present invention is a method for producing the copper/ceramic assembly described above, the method includes: a bonding material arranging step of arranging a bonding material containing Ag and one or more active metals selected from Ti, Zr, Nb, and Hf between the copper member and the ceramic member; a laminating step of laminating the copper member and the ceramic member with the bonding material being interposed therebetween; a carbon component discharging step of charging a laminate of the copper member and the ceramic member into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper member and the ceramic member; and a main bonding step of subjecting the copper member and the ceramic member laminated with the bonding material being interposed therebetween to a heating treatment, in a state of being pressurized in a lamination direction, generating a liquid phase at an interface between the copper member and the ceramic member, and subsequently solidifying the liquid phase by carrying out cooling to bond the copper member to the ceramic member.

According to the method for producing a copper/ceramic assembly of one aspect of the present invention, there is provided a carbon component discharging step of charging a laminate of the copper member and the ceramic member into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper member and the ceramic member. Thereby, it is possible to suppress the generation of the active metal carbide during bonding. Therefore, it is possible to suppress the bonded interface from becoming hard and to suppress the occurrence of breaking in the ceramic member during loading of a thermal cycle.

In the method for producing a copper/ceramic assembly according to one aspect of the present invention, it is preferable that in the bonding material arranging step, an amount of carbon between the copper member and the ceramic member is set to be 200 μg/cm$^2$ or less.

In this case, since the amount of carbon between the copper member and the ceramic member is limited to 200 μg/cm$^2$ or less in the bonding material arranging step, it is possible to further suppress the generation of the active metal carbide during bonding.

The method for producing an insulating circuit substrate according to one aspect of the present invention is a method for producing the insulating circuit substrate described above, the method includes: a bonding material arranging step of arranging a bonding material containing Ag and one or more active metals selected from Ti, Zr, Nb, and Hf between the copper sheet and the ceramic substrate; a laminating step of laminating the copper sheet and the ceramic substrate with the bonding material being interposed therebetween; a carbon component discharging step of charging a laminate of the copper sheet and the ceramic substrate into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper sheet and the ceramic substrate; and a main bonding step of subjecting the copper sheet and the ceramic substrate laminated with the bonding material being interposed therebetween to a heating treatment, in a state of being pressurized in a lamination direction, generating a liquid phase at an interface between the copper sheet and the ceramic substrate, and subsequently solidifying the liquid phase by carrying out cooling to bond the copper sheet to the ceramic substrate.

According to the method for producing an insulating circuit substrate of one aspect of the present invention, there is provided a carbon component discharging step of charging a laminate of the copper sheet and the ceramic substrate into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper sheet and the ceramic substrate. Thereby, it is possible to suppress the generation of the active metal carbide during bonding. Therefore, it is possible to suppress the bonded interface from becoming hard and to suppress the occurrence of breaking in the ceramic substrate during loading of a thermal cycle.

In the method for producing an insulating circuit substrate according to one aspect of the present invention, it is preferable that in the bonding material arranging step, an amount of carbon between the copper sheet and the ceramic substrate is set to be 200 μg/cm$^2$ or less.

In this case, since the amount of carbon between the copper sheet and the ceramic substrate is limited to 200 μg/cm$^2$ or less in the bonding material arranging step, it is possible to further suppress the generation of the active metal carbide during bonding.

Advantageous Effects of Invention

According to one aspect of the present invention, it is possible to provide: a copper/ceramic assembly having an excellent thermal cycle reliability, which can suppress the occurrence of breaking in a ceramic member even in a case where a severe thermal cycle is loaded; an insulating circuit substrate consisting of the copper/ceramic assembly; a method for producing a copper/ceramic assembly; and a method for producing an insulating circuit substrate.

DESCRIPTION OF EMBODIMENTS

Hereinafter, embodiments of the present invention will be described with reference to the accompanying drawings.

Figure 1:
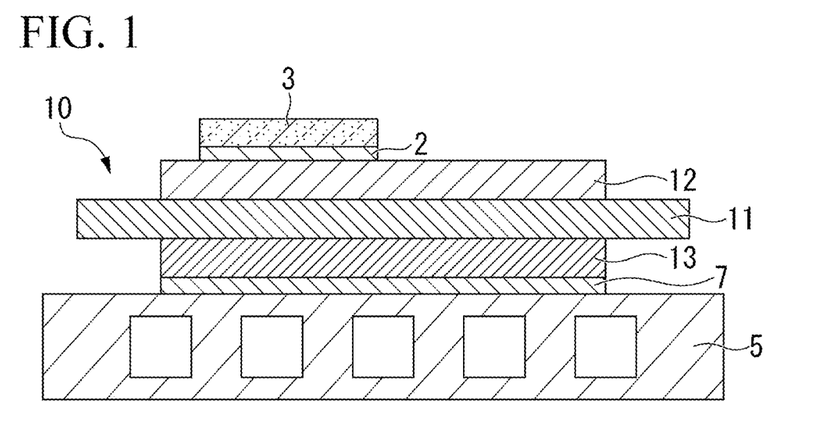
FIG. 1 is a schematic explanatory view of a power module using an insulating circuit substrate according to the embodiment of the present invention.

The copper/ceramic assembly according to the present embodiment is an insulating circuit substrate 10 obtained by bonding a copper sheet 42 (a circuit layer 12) and a copper sheet 43 (a metal layer 13) as copper members consisting of copper or a copper alloy to a ceramic substrate 11 as a ceramic member consisting of ceramics. FIG. 1 shows a power module 1 including the insulating circuit substrate 10 according to the present embodiment.

The power module 1 includes: the insulating circuit substrate 10 in which each of the circuit layer 12 and the metal layer 13 is arranged; a semiconductor element 3 bonded to one surface (the upper surface in FIG. 1) of the circuit layer 12 by interposing a bonding layer 2; and a heat sink 5 disposed on the other surface (the lower surface in FIG. 1) of the metal layer 13.

The semiconductor element 3 includes a semiconductor material such as Si. The semiconductor element 3 and the circuit layer 12 are bonded with the bonding layer 2 being interposed therebetween.

The bonding layer 2 is composed of, for example, an Sn—Ag-based solder material, an Sn—In-based solder material, or an Sn—Ag—Cu-based solder material.

The heat sink 5 is a heat sink for dissipating heat from the insulating circuit substrate 10 described above. The heat sink 5 is composed of copper or a copper alloy, and in the present embodiment, it is composed of phosphorus deoxidized copper. The heat sink 5 includes a passage for allowing a cooling fluid to flow.

It is noted that in the present embodiment, the heat sink 5 is bonded to the metal layer 13 by a solder layer 7 which consists of a solder material. The solder layer 7 is composed of, for example, an Sn—Ag-based solder material, an Sn—In-based solder material, or an Sn—Ag—Cu-based solder material.

In addition, the insulating circuit substrate 10 which is the present embodiment includes, as shown in FIG. 1, the ceramic substrate 11, the circuit layer 12 arranged on one surface of the ceramic substrate 11 (the upper surface in FIG. 1), and the metal layer 13 arranged on the other surface of the ceramic substrate 11 (the lower surface in FIG. 1).

The ceramic substrate 11 is composed of ceramics such as silicon nitride ($Si_3N_4$), aluminum nitride (AlN), and alumina ($Al_2O_3$), which are excellent in terms of insulating properties and heat radiation. In the present embodiment, the ceramic substrate 11 is composed of aluminum nitride (AlN), which is excellent, particularly in terms of heat radiation. In addition, the thickness of the ceramic substrate 11 is set to be, for example, in a range of 0.2 mm or more and 1.5 mm or less, and the thickness thereof is 0.635 mm in the present embodiment.

Figure 4:
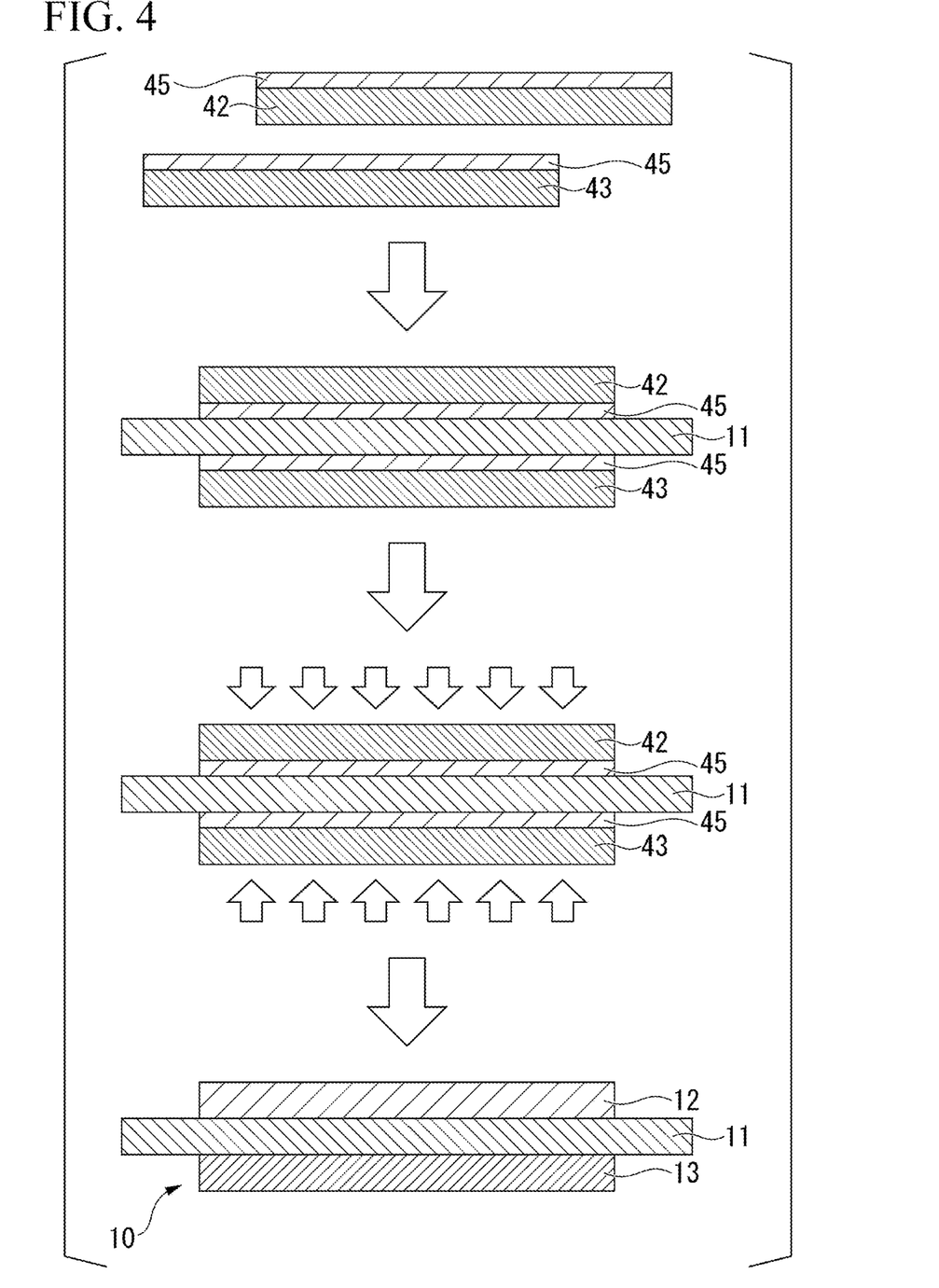
FIG. 4 is a schematic explanatory view of the method for producing the insulating circuit substrate according to the embodiment of the present invention.

As shown in FIG. 4, the circuit layer 12 is formed by bonding the copper sheet 42 consisting of copper or a copper alloy to one surface (the upper surface in FIG. 4) of the ceramic substrate 11.

In the present embodiment, the circuit layer 12 is formed by bonding a rolled sheet of oxygen-free copper to the ceramic substrate 11.

It is noted that the thickness of the copper sheet 42 which is to be the circuit layer 12 is set to be in a range of 0.1 mm or more and 2.0 mm or less, and the thickness is 0.6 mm in the present embodiment.

As shown in FIG. 4, the metal layer 13 is formed by bonding the copper sheet 43 consisting of copper or a copper alloy to the other surface (the lower surface in FIG. 4) of the ceramic substrate 11.

In the present embodiment, the metal layer 13 is formed by bonding a rolled sheet of oxygen-free copper to the ceramic substrate 11.

It is noted that the thickness of the copper sheet 43 which is to be the metal layer 13 is set to be in a range of 0.1 mm or more and 2.0 mm or less, and the thickness is 0.6 mm in the present embodiment.

Figure 2:
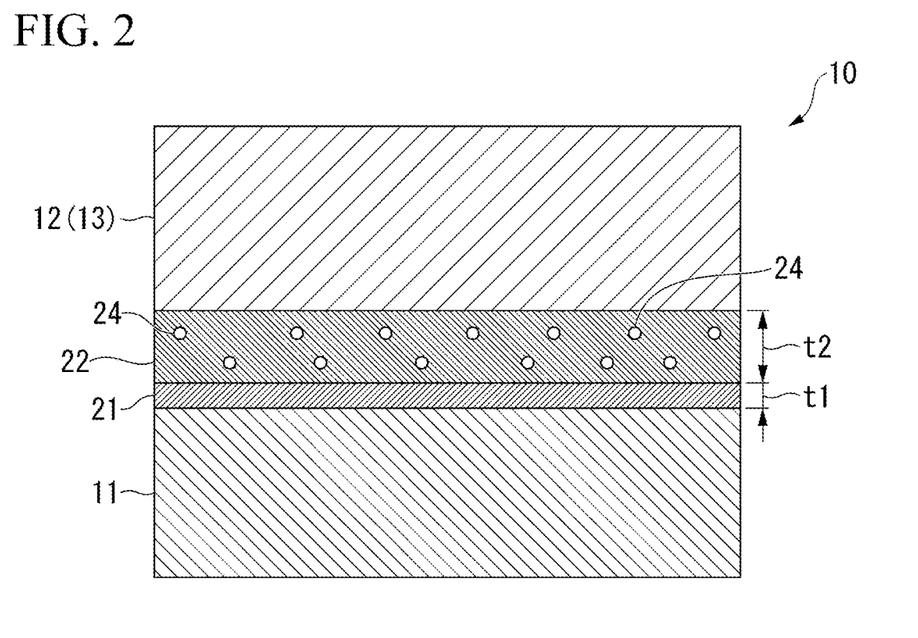
FIG. 2 is an enlarged explanatory view of a bonded interface between a circuit layer (a metal layer) and a ceramic substrate of the insulating circuit substrate according to the embodiment of the present invention.

At the bonded interface between the ceramic substrate 11 and each of the circuit layer 12 and the metal layer 13, as shown in FIG. 2, an active metal compound layer 21 and an Ag—Cu alloy layer 22 are formed in this order from the side of the ceramic substrate 11. It is noted that the active metal compound that constitutes the active metal compound layer 21 does not include an active metal carbide.

It can also be said that the active metal compound layer 21 is a part of the ceramic substrate 11. It can also be said that the Ag—Cu alloy layer 22 is a part of each of the circuit layer 12 and the metal layer 13. For this reason, the bonded interface between the ceramic substrate 11 and each of the circuit layer 12 and the metal layer 13 (the copper sheets 42 and 43) is an interface between the active metal compound layer 21 and the Ag—Cu alloy layer 22. In a case where the Ag—Cu alloy layer 22 is not provided, the bonded interface between the ceramic substrate 11 and each of the circuit layer 12 and the metal layer 13 (the copper sheets 42 and 43) is an interface between the active metal compound layer 21 and each of the circuit layer 12 and the metal layer 13 (the copper sheets 42 and 43).

The active metal compound layer 21 is a layer consisting of a compound of the active metal (one or more selected from Ti, Zr, Nb, and Hf) that is used as the bonding material 45. More specifically, it is a layer consisting of a nitride of these active metals in a case where the ceramic substrate consists of silicon nitride ($Si_3N_4$) or aluminum nitride (AlN), and it is a layer consisting of an oxide of these active metals in a case where the ceramic substrate consists of alumina ($Al_2O_3$).

The active metal compound layer 21 is formed by aggregating particles of an active metal compound. The average particle size of these particles is 10 nm or more and 100 nm or less.

It is noted that in the present embodiment, since a bonding material 45 contains Ti as an active metal and the ceramic substrate 11 is composed of aluminum nitride, the active metal compound layer 21 is composed of titanium nitride (TiN). That is, it is formed by aggregating titanium nitride (TiN) particles having an average particle size of 10 nm or more and 100 nm or less.

In addition, in the insulating circuit substrate 10 which is the present embodiment, an active metal carbide 24 is present, as shown in FIG. 2, at the bonded interfaces between the ceramic substrate 11 and each of the circuit layer 12 and the metal layer 13.

In a cross section along the lamination direction in which the ceramic substrate 11 is laminated with each of the circuit layer 12 and the metal layer 13, in a visual field extending by 10 μm from the surface of the active metal compound layer 21 toward a side of each of the circuit layer 12 and the metal layer 13, an area rate of the active metal carbide 24 is 8% or less.

Further, in the present embodiment, it is preferable that a thickness t1 of the active metal compound layer 21, which is formed at the bonded interface between the ceramic substrate 11 and each of the circuit layer 12 and the metal layer 13, is in a range of 0.05 μm or more and 1.2 μm or less.

In addition, in the present embodiment, it is preferable that a thickness t2 of the Ag—Cu alloy layer 22, which is formed at the bonded interface between the ceramic substrate 11 and each of the circuit layer 12 and the metal layer 13, is in a range of 1 μm or more and 30 μm or less.

Figure 3:
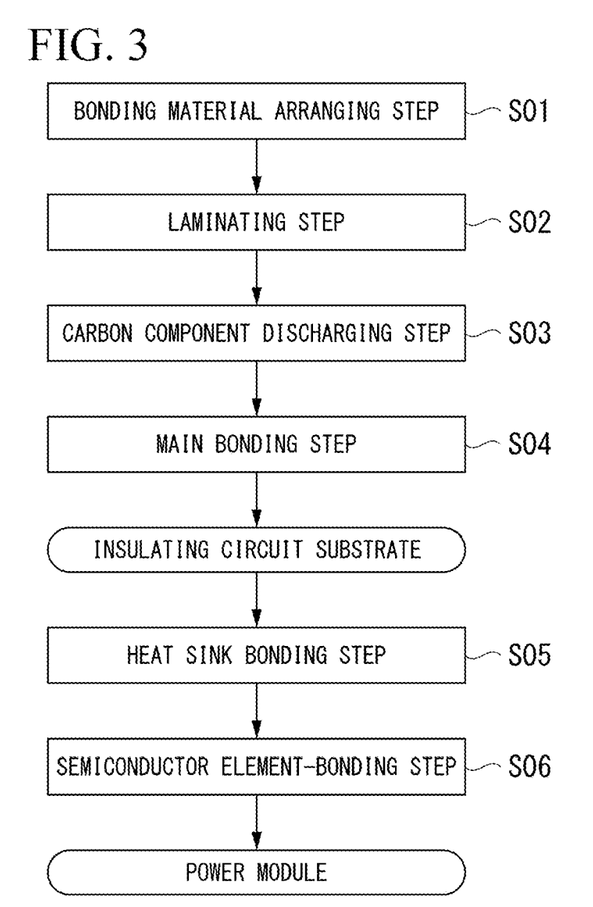
FIG. 3 is a flow chart of a method for producing the insulating circuit substrate according to the embodiment of the present invention.

Hereinafter, a method for producing the insulating circuit substrate 10 according to the present embodiment will be described with reference to FIG. 3 and FIG. 4.

(Bonding Material Arranging Step S01)

The copper sheet 42 which is to be the circuit layer 12 and the copper sheet 43 which is to be the metal layer 13 are prepared.

Then, the bonding material 45 is applied and dried on the bonding surface of the copper sheet 42 which is to be the circuit layer 12 and the bonding surface of the copper sheet 43 which is to be the metal layer 13. The coating thickness of the paste-like bonding material 45 is preferably in a range of 10 μm or more and 50 μm or less after drying.

In the present embodiment, the paste-like bonding material 45 is applied by screen printing.

The bonding material 45 is a bonding material containing Ag and an active metal (Ti, Zr. Nb, or Hf). In the present embodiment, an Ag—Ti-based brazing material (an Ag—Cu—Ti-based brazing material) is used as the bonding material 45. As the Ag—Ti-based brazing material (the Ag—Cu—Ti-based brazing material), it is preferable to use, for example, a brazing material which contains: Cu in an amount of 0% by mass or more and 45% by mass or less; and Ti which is an active metal in an amount of 0.5% by mass or more and 20% by mass or less, with a balance of Ag and inevitable impurities.

The specific surface area of the Ag powder contained in the bonding material 45 is preferably 0.15 $m^2/g$ or more, more preferably 0.25 $m^2/g$ or more, and still more preferably 0.40 $m^2/g$ or more. On the other hand, the specific surface area of the Ag powder contained in the bonding material 45 is preferably 1.40 $m^2/g$ or less, more preferably 1.00 $m^2/g$ or less, and still more preferably 0.75 $m^2/g$ or less.

In the present embodiment, it is preferable that an amount of carbon between each of the copper sheets 42 and 43 and the ceramic substrate 11 is set to be in a range of 5 $\mu g/cm^2$ or more and 200 $\mu g/cm^2$ or less. The amount of carbon is an amount of carbon determined according to the following method. First, for organic components (components excluding the Ag powder and the active metal powder) of the bonding material 45, an amount of a residue (%) in a case where the temperature is raised from room temperature to 500° C. at 10° C./min in an Ar flow atmosphere is measured according to TG-DTA to determine the amount of carbon in the organic components, where the amount is converted to an amount per coating amount. Next, the amount of carbon of the Ag powder and the active metal powder (the amount of carbon of the powder) contained in the bonding material is measured according to a gas analysis (an infrared absorption method). The total of the amount of carbon of the organic components and the amount of carbon of the powder is the amount of carbon.

The amount of carbon can be adjusted by the amounts of carbon contained in the organic component (a solvent, dispersant, or the like), the Ag powder, and the active metal powder which are contained in the bonding material 45.

In a case where the amount of carbon exceeds 200 µg/cm², the discharge of carbon in a carbon component discharging step S03 described below is insufficient, and a portion in the vicinity of the interface is hardened due to an increase in the precipitation density of active metal carbide particles and thus there is a risk that the thermal cycle reliability deteriorates. In addition, the bonding material 45, particularly, the Ag powder and the active metal powder contain a certain amount of carbon, which is hard to be decomposed by heat, as an inevitable impurity, and thus it is difficult to set the amount of carbon to less than 5 µg/cm².

(Laminating Step S02)

Next, the copper sheet 42 which is to be the circuit layer 12 is laminated on one surface (the upper surface in FIG. 4) of the ceramic substrate 11 while interposing the bonding material 45 therebetween, and concurrently, the copper sheet 43 which is to be the metal layer 13 is laminated on the other surface (the lower surface in FIG. 4) of the ceramic substrate 11 while interposing the bonding material 45 therebetween.

(Carbon Component Discharging Step S03)

Next, a laminate of the copper sheet 42, the ceramic substrate 11, and the copper sheet 43 is charged into a heating furnace and heated while introducing an inert gas (He, Ar, or the like) into the furnace and concurrently discharging a gas in the furnace; and thereby, the carbon components (the carbon contained in the organic component (a solvent, dispersant, or the like), the Ag powder, and the active metal powder) between each of the copper sheets 42 and 43 and the ceramic substrate 11 are discharged.

In the carbon component discharging step S03, the furnace pressure of the heating furnace is set to be in a range of 10-6 Pa or more and 103 or less before the inert gas is introduced. Then, an inert gas is introduced into the furnace and a gas in the furnace is discharged, and the amount of the inert gas introduced and the amount of the gas discharged from the furnace are adjusted so that the furnace pressure is in a range of 150 Pa or more and 700 Pa or less.

In a case where the furnace pressure is less than 150 Pa, the discharge of the carbon component is insufficient, a portion in the vicinity of the interface is hardened due to an increase in the precipitation density of active metal carbide particles and the thermal cycle reliability deteriorates, and thus the thermal cycle reliability deteriorates. In a case where the furnace pressure exceeds 700 Pa, the discharge of the carbon component is inhibited, a portion in the vicinity of the interface is hardened due to an increase in the precipitation density of active metal carbide particles, and thus the thermal cycle reliability deteriorates.

In addition, in the carbon component discharging step S03, it is preferable that the temperature and the time are adjusted so that the temperature integral value in a temperature range of 300° C. or higher and 650° C. or lower is in a range of 250° C.·h or more and 1000° C.·h or less.

(Main Bonding Step S04)

Next, the copper sheet 42, the ceramic substrate 11, and the copper sheet 43 are heated in a pressurized state in a heating furnace in a vacuum atmosphere, and the bonding material 45 is melted. Thereafter, cooling is carried out to solidify the molten bonding material 45; and thereby, the copper sheet 42 which is to be the circuit layer 12 is bonded to the ceramic substrate 11, and the copper sheet 43 which is to be the metal layer 13 is bonded to the ceramic substrate 11.

The heating temperature in the main bonding step S04 is preferably set to be in a range of 800° C. or higher and 850° C. or lower. It is preferable that the total of the temperature integral values in the temperature raising step from 780° C. to the heating temperature and the holding step at the heating temperature is set to be in a range of 7° C.·h or more and 120° C.·h or less.

In addition, the pressurization load in the main bonding step S04 is preferably set to be in a range of 0.029 MPa or more and 2.94 MPa or less. It is noted that the load may be applied from the carbon component discharging step S03.

Further, the degree of vacuum in the main bonding step S04 is preferably set to be in a range of $1\times10^{-6}$ Pa or more and $5\times10^{-2}$ Pa or less.

In addition, the cooling rate during cooling is preferably set to be in a range of 2° C./min or more and 20° C./min or less. It is noted that the cooling rate is a cooling rate from the heating temperature to 780° C., which is an Ag—Cu eutectic temperature.

As described above, the insulating circuit substrate 10 which is the present embodiment is produced by the bonding material arranging step S01, the laminating step S02, the carbon component discharging step S03, and the main bonding step S04.

(Heat Sink Bonding Step S05)

Next, the heat sink 5 is bonded to the other surface side of the metal layer 13 of the insulating circuit substrate 10.

The insulating circuit substrate 10 and the heat sink 5 are laminated with a solder material being interposed therebetween and charged into a heating furnace, and the insulating circuit substrate 10 and the heat sink 5 are subjected to solder bonding with the solder layer 7 being interposed therebetween.

(Semiconductor Element-Bonding Step S06)

Next, the semiconductor element 3 is bonded by soldering to one surface of the circuit layer 12 of the insulating circuit substrate 10.

The power module 1 shown in FIG. 1 is produced by the above-described steps.

According to the insulating circuit substrate 10 (copper/ceramic assembly) according to the present embodiment, which is configured as described above, the active metal compound layer 21 is formed on a side of the ceramic substrate 11 at a bonded interface between the ceramic substrate 11 and each of the circuit layer 12 and the metal layer 13, and in a region extending by 10 µm from the active metal compound layer 21 toward a side of each of the circuit layer 12 and the metal layer 13, the area rate of the active metal carbide 24 is 8% or less. Thereby, it is possible to suppress the hardening of the bonded interface, and it is possible to suppress the occurrence of breaking of the ceramic substrate 11 during loading of a thermal cycle.

The area rate of the active metal carbide 24 is preferably 7% or less and more preferably 5% or less. The active metal carbide 24 is preferably not present; however, the area rate of the active metal carbide 24 contained as an inevitable impurity is 0.6% or more.

In addition, in the insulating circuit substrate 10 according to the present embodiment, in a case where a thickness t1 of the active metal compound layer 21 is in a range of 0.05 µm or more and 1.2 µm or less, the ceramic substrate 11 and each of the circuit layer 12 and the metal layer 13 are bonded to each other by the active metal reliably and firmly, and concurrently, the hardening of the bonded interface is suppressed.

The thickness t1 of the active metal compound layer 21 is preferably 0.08 μm or more and 1.0 μm or less and is more preferably 0.15 μm or more and 0.6 μm or less.

Further, in the insulating circuit substrate 10 according to the present embodiment, in a case where the Ag—Cu alloy layer 22 is formed at a bonded interface between the ceramic substrate 11 and each of the circuit layer 12 and the metal layer 13, and a thickness t2 of the Ag—Cu alloy layer 22 is in a range of 1 μm or more and 30 μm or less, Ag contained in the bonding material 45 is sufficiently reacted with the copper sheet 42 which is to be the circuit layer 12 and the copper sheet 43 which is to be the metal layer 13, the ceramic substrate 11 and each of the circuit layer 12 and the metal layer 13 are reliably and firmly bonded to each other, and concurrently, the hardening of the bonded interface is suppressed.

The thickness t2 of the Ag—Cu alloy layer 22 is preferably 3 μm or more and 25 μm or less and is more preferably 5 μm or more and 15 μm or less.

According to the method for producing the insulating circuit substrate 10 according to the present embodiment, there is provided the carbon component discharging step S03 of maintaining a pressure in the furnace in a range of 150 Pa or more and 700 Pa or less and concurrently carrying out heating while discharging a carbon component between the ceramic substrate 11 and each of the copper sheet 42 which is to be the circuit layer 12 and the copper sheet 43 which is to be the metal layer 13, and the carbon component between the ceramic substrate 11 and each of the copper sheets 42 and 43 is discharged, and thus it is possible to suppress the generation of the active metal carbide 24 during bonding. Therefore, it is possible to suppress the bonded interface from becoming hard and to suppress the occurrence of breaking in the ceramic substrate 11 during loading of a thermal cycle.

Further, in the method for producing the insulating circuit substrate 10 according to the present embodiment, in a case where an amount of carbon between the ceramic substrate 11 and each of the copper sheet 42 which is to be the circuit layer 12 and the copper sheet 43 which is to be the metal layer 13 is set to be 200 μg/cm$^2$ or less in the bonding material arranging step S01, it is possible to further suppress the generation of the active metal carbide 24 during bonding.

The amount of carbon is preferably 170 μg/cm$^2$ or less and is more preferably 150 μg/cm$^2$ or less.

Although the embodiments of the present invention were described above, the present invention is not limited thereto, and appropriate modification is possible in a range not departing from the technical features of the invention.

For example, the present embodiment has been described such that a semiconductor element is mounted on an insulating circuit substrate to constitute a power module; however, the present embodiment is not limited thereto. For example, an LED element may be mounted on a circuit layer of an insulating circuit substrate to constitute an LED module, or a thermoelectric element may be mounted on a circuit layer of an insulating circuit substrate to constitute a thermoelectric module.

In addition, in the insulating circuit substrate according to the present embodiment, the description has been made using, as an example, a ceramic substrate composed of aluminum nitride (AlN). However, the present invention is not limited thereto, and the insulating circuit substrate may be an insulating circuit substrate that includes another ceramic substrate such as alumina ($Al_2O_3$) or silicon nitride ($Si_3N_4$).

Further, in the present embodiment, the description has been made using Ti as an example of the active metal contained in the bonding material. However, the present embodiment is not limited thereto, and any one or two or more active metals selected from Ti, Zr, Hf, and Nb may be contained. It is noted that these active metals may be contained as hydrides.

Further, in the present embodiment, the description has been made such that the circuit layer is formed by bonding a rolled sheet of oxygen-free copper to the ceramic substrate. However, the present invention is not limited thereto, and the circuit layer may be formed by bonding copper pieces which are obtained by punching a copper sheet to the ceramic substrate in a state where the copper pieces are disposed in a circuit pattern. In this case, it is sufficient that each of the copper pieces has such an interface structure as described above between the copper piece and the ceramic substrate.

In addition, in the present embodiment, the description has been made such that the bonding material is arranged on the bonding surface of the copper sheet. However, the present invention is not limited thereto, and it is sufficient that the bonding material is arranged between the ceramic substrate and the copper sheet, and the bonding material may be arranged on the bonding surface of the ceramic substrate.

EXAMPLES

Hereinafter, a description will be given for the results of confirmatory experiments carried out to confirm the effectiveness of the present invention.

First, a ceramic substrate (40 mm×40 mm) shown in Table 1 was prepared. It is noted that the thickness was 0.635 mm for AlN and $Al_2O_3$ and the thickness was 0.32 mm for $Si_3N_4$.

In addition, as the copper sheet which was to be each of the circuit layer and the metal layer, a copper sheet consisting of oxygen-free copper and having a size of 37 mm×37 mm and a thickness shown in Table 1 was prepared.

A bonding material containing an Ag powder and an active metal powder shown in Table 1 was applied onto the copper sheet which was to be each of a circuit layer and a metal layer so that the target thickness after drying was the value shown in Table 1.

It is noted that a paste material was used as the bonding material, and the amounts of Ag, Cu, and the active metal were as shown in Table 1.

In addition, vacuum degassing was carried out as a pretreatment by heating at 150° C. for 30 minutes, and the BET value (specific surface area) of the Ag powder was measured using AUTOSORB-1 manufactured by QUANTACHROME Corporation by a BET multipoint method under the conditions of $N_2$ adsorption and liquid nitrogen of 77 K.

The amount of carbon of the bonding material was measured as follows.

First, for organic components of the bonding material, the amount of the residue (%) in a case where the temperature was raised from room temperature to 500° C. at 10° C./min in an Ar flow atmosphere was measured according to TG-DTA to determine the amount of carbon in the organic components, and the amount was converted to an amount per coating amount. Next, the amount of carbon of the Ag powder and the active metal powder (the amount of carbon of the powder) contained in the bonding material was measured according to a gas analysis (an infrared absorption method). The total of the amount of carbon of the organic components and the amount of carbon of the powder was the amount of carbon, which is shown in the table.

Next, a copper sheet which was to be a circuit layer was laminated on one surface of the ceramic substrate. In addition, a copper sheet which was to be a metal layer was laminated on the other surface of the ceramic substrate.

This laminate was charged into a heating furnace. Then, as a carbon discharging step, the pressure in the heating furnace was set to be $3\times10^{-3}$ Pa, and next, an inert gas (Ar gas) was introduced into the furnace, and concurrently, a gas in the furnace was discharged to adjust the furnace pressure to the value shown in Table 2. Further, the temperatures and the times were set so that the temperature integral value in a temperature range of 300° C. or higher and 650° C. or lower was as shown in Table 2.

Next, the laminate was heated in a state of being pressurized in the lamination direction to generate an Ag—Cu liquid phase. At this time, the pressurization load was set to 0.294 MPa, and the temperature integral value in a temperature range of 780° C. or higher and 850° C. or lower was set to a value as shown in Table 2.

Then, the heated laminate was cooled to bond the copper sheet which was to be the circuit layer, the ceramic substrate, and the metal sheet which was to be the metal layer to each other; and thereby, an insulating circuit substrate (copper/ceramic assembly) was obtained.

Regarding the obtained insulating circuit substrate (copper/ceramic assembly), the area rate of the active metal carbide, the thickness t1 of the active metal compound layer, the thickness t2 of the Ag—Cu alloy layer, and the thermal cycle reliability were evaluated as follows.

(Area Rate of Active Metal Carbide)

Figure 5:
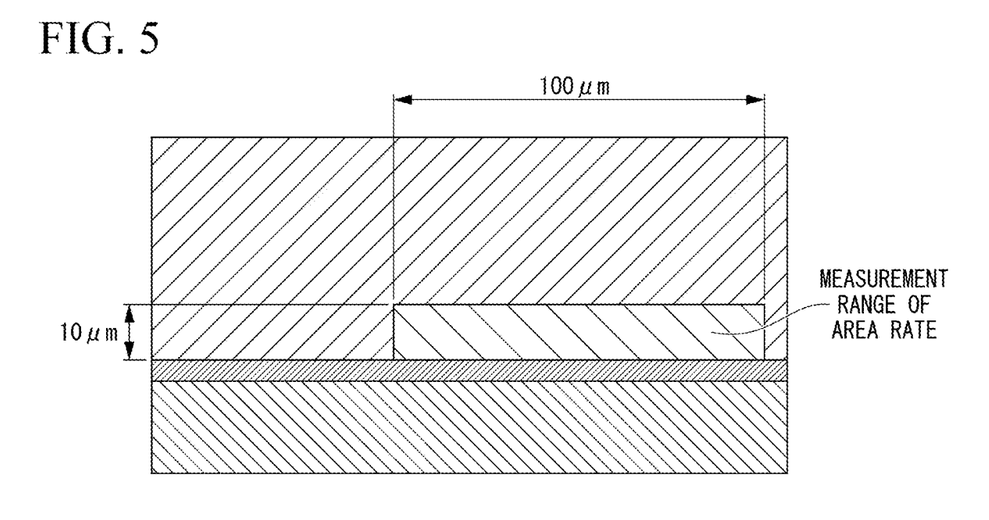
FIG. 5 is an explanatory view showing a method for calculating an area rate of an active metal carbide in Examples of the present invention.

A cross-section of the bonded interface between the ceramic substrate and each of the circuit layer and the metal layer was observed, and an element map of Ag, Cu, the active metal, and the ceramic component in a region of an area S1=100 μm of width×10 μm in thickness direction, as shown in FIG. 5, was acquired in both the five visual fields according to SEM-EDS, from the active metal compound layer toward the side of each of the circuit layer surface and the metal layer surface. It is noted that the ceramic components were Al and N in a case of AlN, the ceramic components were Al and O in a case of $Al_2O_3$, and the ceramic components were Si and N in a case of $Si_3N_4$.

In the map of the active metal, a region excluding an overlapping part in which the active metal and other components were overlapped was defined as an "active metal carbide", and an area S2 thereof was calculated.

The area rate of the active metal carbide was defined by 100×S2/S1, and Table 2 shows the average values from both the five visual fields, that is, a total of ten visual fields. It is noted that in a case where the active metal compound layer undulated, the region was along the undulations.

(Active Metal Compound Layer)

Cross sections of the bonded interface between the circuit layer and the ceramic substrate and the bonded interface between the ceramic substrate and the metal layer were subjected to measurement at a magnification of 30000 times using an electron scanning microscope (ULTRA55 manufactured by Carl Zeiss NTS, LLC, acceleration voltage: 1.8 kV), and element mapping of N, O, and the active metal element was carried out to acquire the electron maps thereof for both the five visual fields according to the energy dispersive X-ray analysis method. It was determined that the active metal compound layer was present in a case where the active metal element and N or O were present in the same region.

The observation was carried out in both the five visual fields, that is, a total of ten visual fields, and the average value obtained by dividing the area in the range in which the active metal element and N or O were present in the same region by the measured width was defined as the "thickness of the active metal compound layer", which is shown in Table 2.

(Ag—Cu Alloy Layer)

In cross sections of the bonded interface between the circuit layer and the ceramic substrate and the bonded interface between the ceramic substrate and the metal layer, element mapping of Ag, Cu, and the active metal was carried out to acquire the electron maps thereof by using an EPMA device. Element mapping was carried out to acquire the electron map of each element in both the five visual fields.

The observation was carried out in both the five visual fields, that is, a total of ten visual fields, and in a case where Ag+Cu+active metal was set to 100% by mass, a region in which the Ag concentration was 15% by mass or more was defined as the Ag—Cu alloy layer, and an area thereof was measured to determine a value obtained by dividing the area by a width of the measurement region (area/width of measurement region). The average of the values is shown in Table 2 as the thickness of the Ag—Cu alloy layer.

(Thermal Cycle Reliability)

The above-described insulating circuit substrate was subjected to the following thermal cycle according to the material of the ceramic substrate to determine the presence or absence of ceramic breaking by an SAT examination (ultrasonic examination). The evaluation results are shown in Table 2.

In a case of AlN or $Al_2O_3$: the SAT examination was carried out every 50 cycles up to 500 cycles of −40° C.×10 min↔150° C.×10 min.

In a case of $Si_3N_4$: the SAT examination was carried out every 200 cycles up to 2000 cycles of −40° C.×5 min↔150° C.×10 min.

TABLE 1

| | | Ceramic substrate Material | Circuit layer Thickness mm | Metal layer Thickness mm | Bonding material | | | | | | |
|---|---|---|---|---|---|---|---|---|---|---|---|
| | | | | | | Cu | Active material | | BET value of Ag powder $m^2/g$ | Coating thickness μm | Amount of carbon μg/cm² |
| | | | | | Ag | mass % | Element | mass % | | | |
| Invention Example | 1 | AlN | 0.3 | 0.25 | Balance | 35.5 | Ti | 3.5 | 0.16 | 50 | 197.6 |
| | 2 | AlN | 0.3 | 0.25 | Balance | — | Hf | 5.7 | 1.38 | 30 | 23.2 |
| | 3 | AlN | 0.3 | 0.25 | Balance | 28.5 | Ti | 2.5 | 0.56 | 30 | 113.9 |
| | 4 | $Si_3N_4$ | 0.8 | 0.8 | Balance | — | Ti | 10.4 | 0.44 | 30 | 83.7 |

TABLE 1-continued

| | | Ceramic substrate Material | Circuit layer Thickness mm | Metal layer Thickness mm | Bonding material | | | | | | |
|---|---|---|---|---|---|---|---|---|---|---|---|
| | | | | | Ag | Cu mass % | Active material Element | mass % | BET value of Ag powder m²/g | Coating thickness μm | Amount of carbon μg/cm² |
| | 5 | Si₃N₄ | 0.8 | 0.8 | Balance | 28.5 | Zr | 4.5 | 1.38 | 10 | 5.3 |
| | 6 | Si₃N₄ | 0.8 | 0.8 | Balance | 24.5 | Hf | 3.5 | 1.03 | 30 | 168.2 |
| | 7 | Al₂O₃ | 0.3 | 0.25 | Balance | 35.5 | Zr | 1.5 | 1.03 | 30 | 54.3 |
| | 8 | Al₂O₃ | 0.3 | 0.25 | Balance | — | Nb | 6.8 | 0.56 | 30 | 135.7 |
| Comparative Example | 1 | AlN | 0.3 | 0.25 | Balance | 35.5 | Hf | 2.5 | 0.16 | 30 | 167.8 |
| | 2 | AlN | 0.3 | 0.25 | Balance | 35.5 | Hf | 2.5 | 0.16 | 30 | 167.8 |
| | 3 | Si₃N₄ | 0.8 | 0.8 | Balance | — | Ti | 8.8 | 0.44 | 30 | 142.3 |
| | 4 | Si₃N₄ | 0.8 | 0.8 | Balance | — | Ti | 8.8 | 0.44 | 30 | 142.3 |
| | 5 | Al₂O₃ | 0.3 | 0.25 | Balance | — | Zr | 7.5 | 0.56 | 30 | 152.4 |
| | 6 | Al₂O₃ | 0.3 | 0.25 | Balance | — | Zr | 7.5 | 0.56 | 30 | 152.4 |

TABLE 2

| | | Carbon component discharging step | | Main bonding step | Area rate of | Thickness of active metal | Thickness of | Thermal cycle reliability |
|---|---|---|---|---|---|---|---|---|
| | | Pressure of inert gas Pa | Temperature integral value °C·h | Temperature integral value °C·h | active metal carbide % | compound layer t1 μm | Ag—Cu alloy layer t2 μm | Breaking occurrence (number of cycles) |
| Invention Example | 1 | 150 | 252.1 | 50.8 | 7.9 | 0.89 | 28 | 300th |
| | 2 | 250 | 702.1 | 37.5 | 2.7 | 0.64 | 12 | 500th |
| | 3 | 600 | 315.4 | 87.5 | 6.6 | 1.17 | 9 | 400th |
| | 4 | 600 | 307.4 | 7.3 | 5.9 | 0.06 | 18 | 1800th |
| | 5 | 400 | 977.1 | 29.2 | 0.6 | 0.26 | 3 | >2000th |
| | 6 | 300 | 552.1 | 118.6 | 2.1 | 0.47 | 6 | >2000th |
| | 7 | 500 | 443.4 | 39.1 | 3.6 | 0.43 | 8 | 450th |
| | 8 | 700 | 310.4 | 62.4 | 6.8 | 0.50 | 7 | 400th |
| Comparative Example | 1 | 50 | 552.1 | 37.5 | 13.2 | 0.54 | 28 | 50th |
| | 2 | 1200 | 552.1 | 37.5 | 11.3 | 0.52 | 29 | 50th |
| | 3 | 80 | 552.1 | 37.5 | 10.8 | 0.35 | 10 | 1200th |
| | 4 | 1500 | 552.1 | 37.5 | 9.3 | 0.38 | 10 | 1400th |
| | 5 | 80 | 552.1 | 37.5 | 11.2 | 0.42 | 11 | 100th |
| | 6 | 1200 | 552.1 | 37.5 | 10.7 | 0.43 | 11 | 150th |

First, Invention Examples 1 to 3 and Comparative Examples 1 and 2, in which AlN has been used as a ceramic substrate, are compared.

In Comparative Example 1, the furnace pressure in the carbon component discharging step was set to 50 Pa, and in a region extending by 10 μm from the active metal compound layer toward a side of the copper sheet, the area rate of the active metal carbide reached 13.2%. In addition, in the thermal cycle test, the number of cycles leading to breaking occurrence was 50 cycles, and the thermal cycle reliability was insufficient.

In Comparative Example 2, the furnace pressure in the carbon component discharging step was set to 1200 Pa, and in a region extending by 10 μm from the active metal compound layer toward a side of the copper sheet, the area rate of the active metal carbide reached 11.3%. In addition, in the thermal cycle test, the number of cycles leading to breaking occurrence was 50 cycles, and the thermal cycle reliability was insufficient.

On the other hand, in Invention Examples 1 to 3, the furnace pressures in the carbon component discharging step were set to 150 Pa, 250 Pa, and 600 Pa, respectively, and in a region extending by 10 μm from the active metal compound layer toward a side of the copper sheet, the area rates of the active metal carbide reached 7.9%, 2.7%, and 6.6%, respectively. In addition, in the thermal cycle test, the numbers of cycles leading to breaking occurrence were 300 cycles, 500 cycles, and 400 cycles, respectively, and the thermal cycle reliability was excellent.

Next, Invention Examples 4 to 6 and Comparative Examples 3 and 4, in which Si₃N₄ has been used as a ceramic substrate, are compared.

In Comparative Example 3, the furnace pressure in the carbon component discharging step was set to 80 Pa, and in a region extending by 10 μm from the active metal compound layer toward a side of the copper sheet, the area rate of the active metal carbide reached 10.8%. In addition, in the thermal cycle test, the number cycles leading to breaking occurrence was 1200 cycles, and the thermal cycle reliability was insufficient.

In Comparative Example 4, the furnace pressure in the carbon component discharging step was set to 1500 Pa, and in a region extending by 10 μm from the active metal compound layer toward a side of the copper sheet, the area rate of the active metal carbide reached 9.3%. In addition, in the thermal cycle test, the number of cycles leading to breaking occurrence was 1400 cycles, and the thermal cycle reliability was insufficient.

On the other hand, in Invention Examples 4 to 6, the furnace pressures in the carbon component discharging step were set to 600 Pa, 400 Pa, and 300 Pa, respectively, and in a region extending by 10 μm from the active metal compound layer toward a side of the copper sheet, the area rates of the active metal carbide reached 5.9%, 0.6%, and 2.1%, respectively. In addition, in the thermal cycle test, the numbers of cycles leading to breaking occurrence were 1800 cycles, more than 2000 cycles, and more than 2000 cycles, respectively, and the thermal cycle reliability was excellent.

Next, Invention Examples 7 and 8 and Comparative Example 5, in which $Al_2O_3$ has been used as a ceramic substrate, are compared.

In Comparative Example 5, the furnace pressure in the carbon component discharging step was set to 80 Pa, and in a region extending by 10 μm from the active metal compound layer toward a side of the copper sheet, the area rate of the active metal carbide reached 11.2%. In addition, in the thermal cycle test, the number of cycles leading to breaking occurrence was 100 cycles, and the thermal cycle reliability was insufficient.

In Comparative Example 6, the furnace pressure in the carbon component discharging step was set to 1200 Pa, and in a region extending by 10 μm from the active metal compound layer toward a side of the copper sheet, the area rate of the active metal carbide reached 10.7%. In addition, in the thermal cycle test, the number of cycles leading to breaking occurrence was 150 cycles, and the thermal cycle reliability was insufficient.

On the other hand, in Invention Examples 7 and 8, the furnace pressures in the carbon component discharging step were set to 500 Pa and 700 Pa, respectively, and in a region extending by 10 μm from the active metal compound layer toward a side of the copper sheet, the area rates of the active metal carbide reached 3.6% and 6.8%, respectively. In addition, in the thermal cycle test, the numbers of cycles leading to breaking occurrence were 450 cycles and 500 cycles, respectively, and the thermal cycle reliability was excellent.

As a result of the above-described checking experiments, according to Invention Examples, it has been confirmed that it is possible to provide an insulating circuit substrate (a copper/ceramic assembly) having an excellent thermal cycle reliability, which can suppress the occurrence of breaking in a ceramic member even in a case where a severe thermal cycle is loaded, and a method for producing an insulating circuit substrate (a method for producing a copper/ceramic assembly).

INDUSTRIAL APPLICABILITY

The copper/ceramic assembly and the insulating circuit substrate according to the present embodiment are suitably applied to power modules, LED modules, and thermoelectric modules.

REFERENCE SIGNS LIST

10: Insulating circuit substrate (copper/ceramic assembly)
11: Ceramic substrate (ceramic member)
12: Circuit layer (copper member)
13: Metal layer (copper member)
21: Active metal compound layer
22: Ag—Cu alloy layer

What is claimed is:

1. A copper/ceramic assembly obtained by bonding a copper member consisting of copper or a copper alloy to a ceramic member,
   wherein at a bonded interface between the ceramic member and the copper member, an active metal compound layer is formed on a side of the ceramic member, and
   in a region extending by 10 μm from the active metal compound layer toward a side of the copper member, an area rate of an active metal carbide is 0.6% or more and 8% or less.

2. The copper/ceramic assembly according to claim 1,
   wherein a thickness t1 of the active metal compound layer is in a range of 0.05 μm or more and 1.2 μm or less.

3. The copper/ceramic assembly according to claim 1,
   wherein at the bonded interface between the ceramic member and the copper member, an Ag—Cu alloy layer is formed on the side of the copper member, and
   a thickness t2 of the Ag—Cu alloy layer is in a range of 1 μm or more and 30 μm or less.

4. An insulating circuit substrate obtained by bonding a copper sheet consisting of copper or a copper alloy to a surface of a ceramic substrate,
   wherein at a bonded interface between the ceramic substrate and the copper sheet, an active metal compound layer is formed on a side of the ceramic substrate, and
   in a region extending by 10 μm from the active metal compound layer toward a side of the copper sheet, an area rate of an active metal carbide is 0.6% or more and 8% or less.

5. The insulating circuit substrate according to claim 4,
   wherein a thickness t1 of the active metal compound layer is in a range of 0.05 μm or more and 1.2 μm or less.

6. The insulating circuit substrate according to claim 4,
   wherein at the bonded interface between the ceramic substrate and the copper sheet, an Ag—Cu alloy layer is formed on the side of the copper sheet, and
   a thickness t2 of the Ag—Cu alloy layer is in a range of 1 μm or more and 30 μm or less.

7. A method for producing the copper/ceramic assembly according to claim 1, the method comprising:
   a bonding material arranging step of arranging a bonding material containing Ag and one or more active metals selected from Ti, Zr, Nb, and Hf between the copper member and the ceramic member;
   a laminating step of laminating the copper member and the ceramic member with the bonding material being interposed therebetween;
   a carbon component discharging step of charging a laminate of the copper member and the ceramic member into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper member and the ceramic member; and
   a main bonding step of subjecting the copper member and the ceramic member laminated with the bonding material being interposed therebetween to a heating treatment, in a state of being pressurized in a lamination direction, generating a liquid phase at an interface between the copper member and the ceramic member, and subsequently solidifying the liquid phase by carrying out cooling to bond the copper member to the ceramic member.

8. The method for producing a copper/ceramic assembly according to claim 7,
wherein in the bonding material arranging step, an amount of carbon between the copper member and the ceramic member is set to be 200 μg/cm² or less.

9. A method for producing the insulating circuit substrate according to claim 4, the method comprising:
a bonding material arranging step of arranging a bonding material containing Ag and one or more active metals selected from Ti, Zr, Nb, and Hf between the copper sheet and the ceramic substrate;
a laminating step of laminating the copper sheet and the ceramic substrate with the bonding material being interposed therebetween;
a carbon component discharging step of charging a laminate of the copper sheet and the ceramic substrate into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper sheet and the ceramic substrate; and
a main bonding step of subjecting the copper sheet and the ceramic substrate laminated with the bonding material being interposed therebetween to a heating treatment, in a state of being pressurized in a lamination direction, generating a liquid phase at an interface between the copper sheet and the ceramic substrate, and subsequently solidifying the liquid phase by carrying out cooling to bond the copper sheet to the ceramic substrate.

10. The method for producing an insulating circuit substrate according to claim 9,
wherein in the bonding material arranging step, an amount of carbon between the copper sheet and the ceramic substrate is set to be 200 μg/cm² or less.

11. The copper/ceramic assembly according to claim 2,
wherein at the bonded interface between the ceramic member and the copper member, an Ag—Cu alloy layer is formed on the side of the copper member, and
a thickness t2 of the Ag—Cu alloy layer is in a range of 1 μm or more and 30 μm or less.

12. The insulating circuit substrate according to claim 5,
wherein at the bonded interface between the ceramic substrate and the copper sheet, an Ag—Cu alloy layer is formed on the side of the copper sheet, and
a thickness t2 of the Ag—Cu alloy layer is in a range of 1 μm or more and 30 μm or less.

13. A method for producing the copper/ceramic assembly according to claim 2, the method comprising:
a bonding material arranging step of arranging a bonding material containing Ag and one or more active metals selected from Ti, Zr, Nb, and Hf between the copper member and the ceramic member;
a laminating step of laminating the copper member and the ceramic member with the bonding material being interposed therebetween;
a carbon component discharging step of charging a laminate of the copper member and the ceramic member into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper member and the ceramic member; and
a main bonding step of subjecting the copper member and the ceramic member laminated with the bonding material being interposed therebetween to a heating treatment, in a state of being pressurized in a lamination direction, generating a liquid phase at an interface between the copper member and the ceramic member, and subsequently solidifying the liquid phase by carrying out cooling to bond the copper member to the ceramic member.

14. The method for producing a copper/ceramic assembly according to claim 13,
wherein in the bonding material arranging step, an amount of carbon between the copper member and the ceramic member is set to be 200 μg/cm² or less.

15. A method for producing the insulating circuit substrate according to claim 5, the method comprising:
a bonding material arranging step of arranging a bonding material containing Ag and one or more active metals selected from Ti, Zr, Nb, and Hf between the copper sheet and the ceramic substrate;
a laminating step of laminating the copper sheet and the ceramic substrate with the bonding material being interposed therebetween;
a carbon component discharging step of charging a laminate of the copper sheet and the ceramic substrate into a heating furnace, maintaining a pressure in the furnace in a range of 150 Pa or more and 700 Pa or less and concurrently carrying out heating while introducing an inert gas into the furnace and concurrently discharging a gas in the furnace, and thereby, discharging the carbon component between the copper sheet and the ceramic substrate; and
a main bonding step of subjecting the copper sheet and the ceramic substrate laminated with the bonding material being interposed therebetween to a heating treatment, in a state of being pressurized in a lamination direction, generating a liquid phase at an interface between the copper sheet and the ceramic substrate, and subsequently solidifying the liquid phase by carrying out cooling to bond the copper sheet to the ceramic substrate.

16. The method for producing an insulating circuit substrate according to claim 15,
wherein in the bonding material arranging step, an amount of carbon between the copper sheet and the ceramic substrate is set to be 200 μg/cm² or less.

* * * * *